(12) United States Patent
Sugihara et al.

(10) Patent No.: US 10,103,750 B2
(45) Date of Patent: Oct. 16, 2018

(54) ERROR CORRECTION DECODING APPARATUS

(71) Applicant: MITSUBISHI ELECTRIC CORPORATION, Tokyo (JP)

(72) Inventors: Kenya Sugihara, Tokyo (JP); Wataru Matsumoto, Tokyo (JP); Hideo Yoshida, Tokyo (JP); Yoshikuni Miyata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 145 days.

(21) Appl. No.: 15/037,031

(22) PCT Filed: Nov. 7, 2014

(86) PCT No.: PCT/JP2014/079602
§ 371 (c)(1),
(2) Date: May 16, 2016

(87) PCT Pub. No.: WO2015/087643
PCT Pub. Date: Jun. 18, 2015

(65) Prior Publication Data
US 2016/0294415 A1    Oct. 6, 2016

(30) Foreign Application Priority Data
Dec. 9, 2013  (JP) .................. 2013-253952

(51) Int. Cl.
*H03M 13/00*  (2006.01)
*H03M 13/11*  (2006.01)
(Continued)

(52) U.S. Cl.
CPC ...... *H03M 13/112* (2013.01); *H03M 13/1114* (2013.01); *H03M 13/1122* (2013.01);
(Continued)

(58) Field of Classification Search
CPC ........... H03M 13/255; H03M 13/3927; H03M 13/112; H03M 13/658; H03M 13/6583;
(Continued)

(56) References Cited

U.S. PATENT DOCUMENTS

2005/0138519 A1    6/2005  Boutillon et al.
2005/0210366 A1*   9/2005  Maehata ............ H03M 13/1117
                                                         714/794
(Continued)

FOREIGN PATENT DOCUMENTS

EP    1 881 610 A1    1/2008
JP    4341646 B2     10/2009
(Continued)

OTHER PUBLICATIONS

"Architecture generique de decodeur de codes LDPC" Jul. 2, 2004 pp. 1-166, XP002370625.
(Continued)

*Primary Examiner* — Albert Decady
*Assistant Examiner* — Osman M Alshack
(74) *Attorney, Agent, or Firm* — Birch, Stewart, Kolasch & Birch, LLP

(57) ABSTRACT

An error correction decoding apparatus includes column operators 201 and row operators 211 to 213 provided respectively in accordance with the columns and rows of a check matrix of an LDPC code. A received LLR (log-likelihood ratio) of a received sequence is input into the column operators 201 together with row LLRs from the row operators 211 to 213, whereupon the column operators 201 calculate a total value $z_1$ of the received LLR of the received sequence and the row LLRs from the row operators 211 to 213. The row operators 211 to 213 hold operation results relating to row LLRs or column LLRs obtained during a previous operation, calculate column LLRs using the total
(Continued)

value input from the column operators 201 and the held operation results, calculate row LLRs from the calculated column LLRs, and output the calculated row LLRs to the column operators 201.

15 Claims, 10 Drawing Sheets

(51) Int. Cl.
  *H03M 13/29* (2006.01)
  *H03M 13/39* (2006.01)
(52) U.S. Cl.
  CPC ... *H03M 13/1137* (2013.01); *H03M 13/2909* (2013.01); *H03M 13/3977* (2013.01); *H03M 13/658* (2013.01); *H03M 13/6583* (2013.01); *H03M 13/1154* (2013.01)
(58) Field of Classification Search
  CPC ......... H03M 13/2909; H03M 13/3977; H03M 13/1114; H03M 13/1122; H03M 13/1137; H03M 13/1154
  USPC ................................. 714/752, 776, 800–805
  See application file for complete search history.

(56) References Cited

U.S. PATENT DOCUMENTS

| | | | |
|---|---|---|---|
| 2006/0026486 A1 | 2/2006 | Richardson et al. | |
| 2008/0028282 A1 | 1/2008 | Zhong et al. | |
| 2008/0246639 A1* | 10/2008 | Sakai | H03M 13/1117 341/107 |
| 2009/0063930 A1* | 3/2009 | Matsumoto | H03M 13/1102 714/752 |
| 2009/0100312 A1* | 4/2009 | Uchikawa | H03M 13/112 714/752 |
| 2009/0132887 A1* | 5/2009 | Matsumoto | H03M 13/1117 714/752 |
| 2009/0265600 A1* | 10/2009 | Matsumoto | H03M 13/1117 714/752 |
| 2010/0325514 A1* | 12/2010 | Sugihara | H03M 13/112 714/752 |
| 2013/0111292 A1* | 5/2013 | Obata | H03M 13/112 714/752 |

FOREIGN PATENT DOCUMENTS

| | | |
|---|---|---|
| JP | 2011-4229 A | 1/2011 |
| JP | 4739089 B2 | 8/2011 |
| WO | WO 2006/059688 A1 | 6/2006 |
| WO | WO 2009/004572 A1 | 1/2009 |

OTHER PUBLICATIONS

"A Memory Efficient Partially Parallel Decoder Architecture for Quasi-Cyclic LDPC Codes", IEEE Transactions on Very Large Scale Integration (VLSI) Systems, vol. 15, No. 4, Apr. 1, 2007, pp. 483-488, XP011179766.

Abematsu et al., "Low Complexity LDPC Decoding Algorithm with Controled LLRs Updated Process", IEICE Technical Report, vol. 106, No. 555, RCS2006-255, Feb. 28, 2007, pp. 81-86.

Miyata et al., "A Study of Decoding Method for QC-LDPC Codes", The 31st Symposium on Information Theory and its Applications, (SITA2008), Kinugawa, Tochigi, Japan, Oct. 7-10, 2008, pp. 123-128.

Sakai et al., "Low Complexity Decoding Algorithm for LDPC Codes and Its Discretized Density Evolution—Performance Evaluation for δ-Min Decoding by Discretized Density Evolution—", The Institute of Electronics, Information and Communication Engineers, Technical Report of IEICE, 105(196), 2005, pp. 13-18.

Sakai et al., "Reduced Complexity Decoding Based on Approximation of Update Function for Low-Density Parity-Check Codes", Institute of Electronics, Information and Communication Engineers, IEICE Journal A, vol. J90-A, No. 2, Feb. 2007, pp. 83-91.

* cited by examiner

Prior Art    FIG. 1
$$\begin{bmatrix} 1 & 0 & 0 & 1 & 0 & 0 & 1 & 0 & 1 & 0 & 0 & 1 \\ 0 & 1 & 0 & 0 & 0 & 1 & 0 & 1 & 0 & 0 & 1 & 0 \\ 0 & 0 & 0 & 0 & 1 & 0 & 1 & 0 & 1 & 1 & 0 & 0 \\ 0 & 1 & 0 & 1 & 0 & 0 & 1 & 1 & 0 & 1 & 0 & 0 \\ 1 & 0 & 1 & 0 & 0 & 1 & 0 & 0 & 0 & 0 & 1 & 0 \\ 1 & 0 & 1 & 0 & 1 & 0 & 0 & 0 & 0 & 1 & 0 & 1 \end{bmatrix}$$
Prior Art    FIG. 2
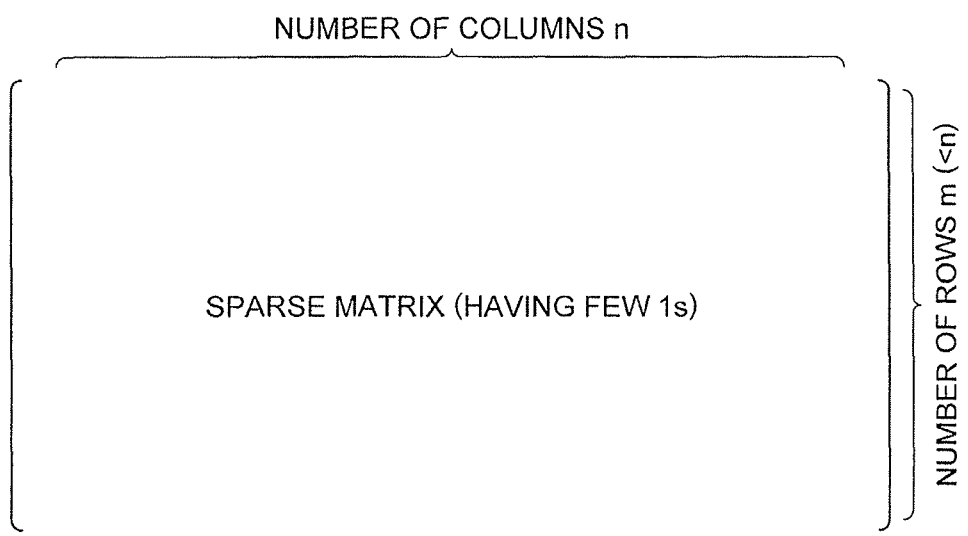

Prior Art FIG. 3A
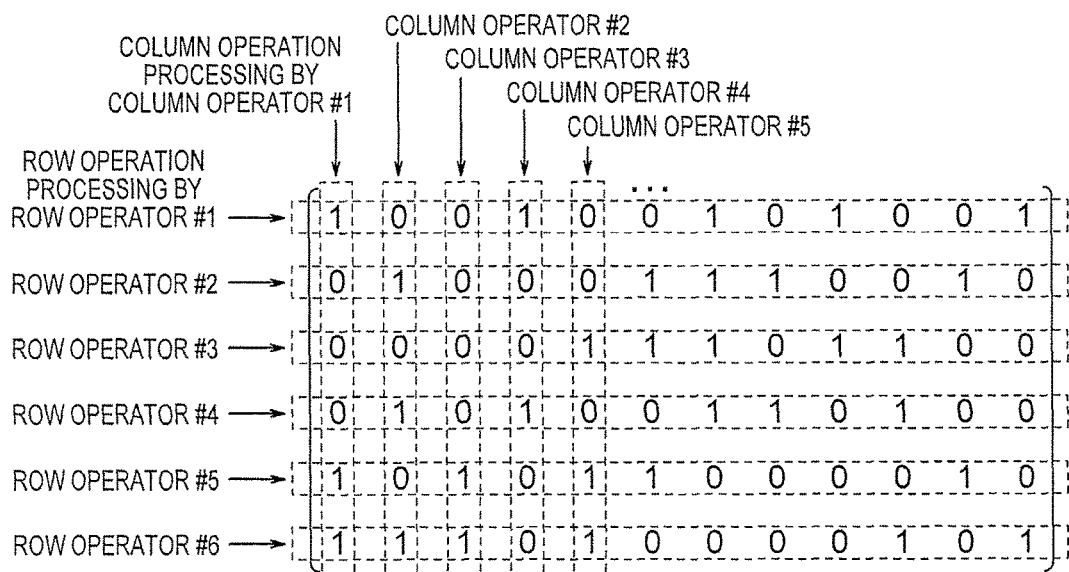
Prior Art FIG. 3B
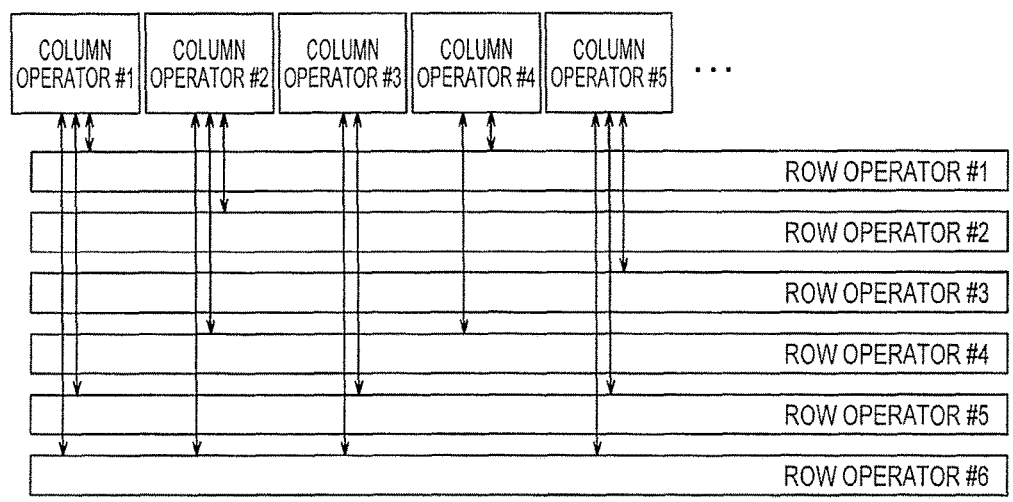

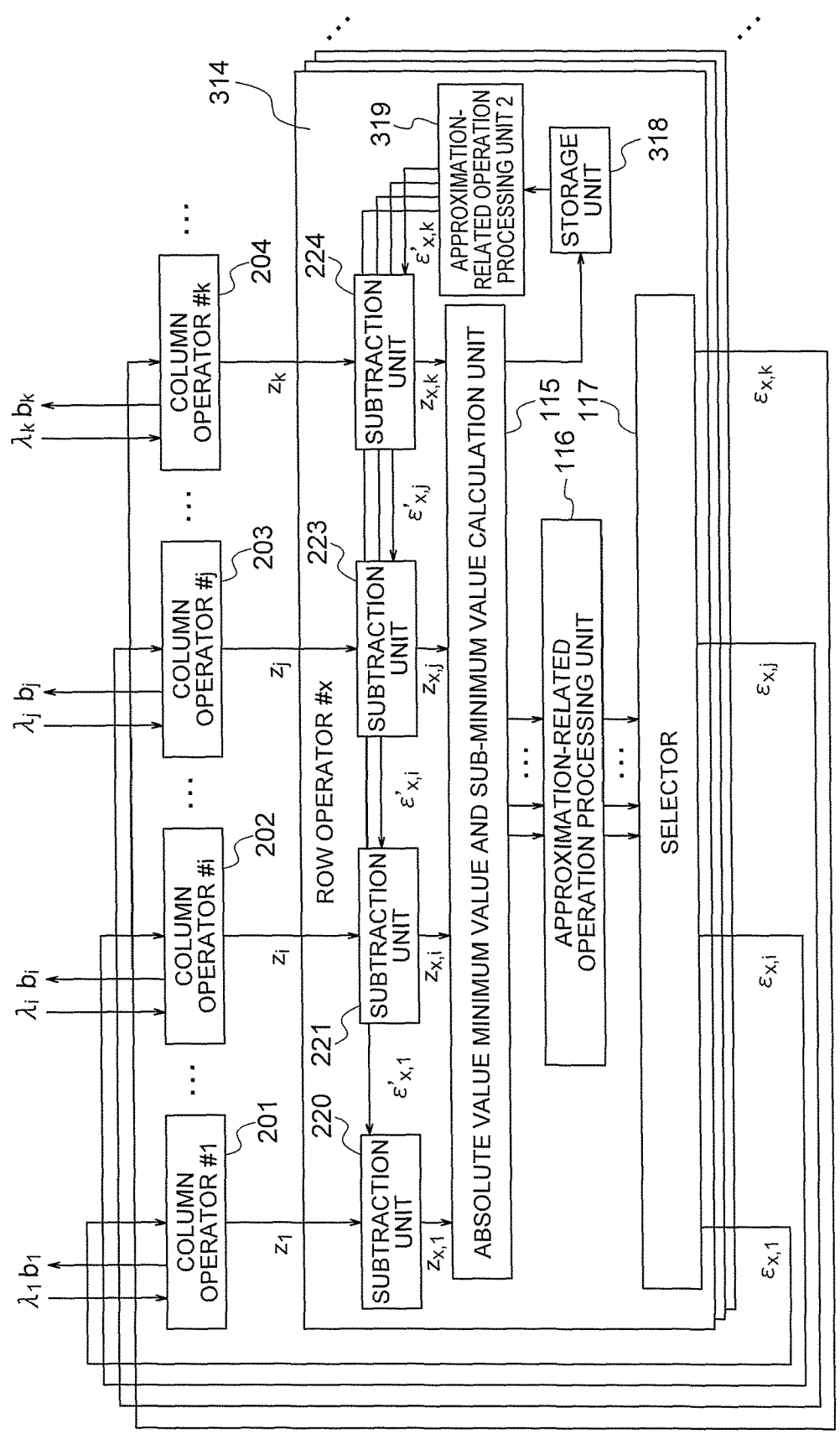

ERROR CORRECTION DECODING APPARATUS

TECHNICAL FIELD

This invention relates to an error correction decoding apparatus, and more particularly to an error correction decoding apparatus that decodes a received sequence encoded using a low-density parity-check code (referred to hereafter as an LDPC code).

BACKGROUND ART

An LDPC code, an example of which is shown in FIG. 1, is a linear code defined by a parity-check matrix in which the number of is is sparse (in other words, a majority of the matrix elements are 0 and the number of is in proportion to the whole is small). When, at this time, the size of the parity-check matrix is set at m×n (where m<n), as shown in FIG. 2, a code length of the LDPC code is n and a rank of the parity-check matrix corresponds to a parity bit length m. When the parity-check matrix is a full rank matrix (i.e. when the rank matches the number of rows), the parity bit length is m and an information sequence length is n-m.

A sum-product decoding method, such as that described in PTL 1, for example, may be cited as a representative decoding method for decoding an LDPC code. In the sum-product decoding method, decoding is performed by performing an iterative operation while calculating a log likelihood ratio (referred to hereafter as an LLR) as probabilistic reliability information relating to a received signal (a received sequence). The sum-product decoding method consists of two operations known as a column operation and a row operation, and the two operations correspond respectively to the columns and rows of the parity-check matrix. When parts that perform the column operation and the row operation are mounted on a circuit or the like, the parts are referred to respectively as a column operator and a row operator, but may also be referred to respectively as a bit node and a check node.

A specific operation of the sum-product decoding method will now be described. A decoding operation is performed by repeating two operations, namely a row operation and a column operation, alternately using as input received log likelihood ratios (referred to hereafter as received LLRs) calculated from the received sequence respectively in relation to the number of bits corresponding to the code length.

In the row operation, when $N(r)$ is set as a set of column numbers at which an element on an $r^{th}$ row of the parity-check matrix is 1, a row LLR $\varepsilon_{r,c}$ is calculated in relation to each column c included in $N(r)$ using Equation (1), shown below. On the right side of Equation (1), $z_{r,c'}$ is a column LLR calculated in the column operation, to be described below, and during a first iteration of the sum-product decoding method, a received LLR $\lambda_c$ corresponding to the column c is substituted for $z_{r,c'}$.

[Numeral 1]

$$\varepsilon_{r,c} = \left( \prod_{c' \in N(r) \setminus \{c\}} \operatorname{sgn}(z_{r,c'}) \right) \cdot \left( \bigotimes_{c' \in N(r) \setminus \{c\}} |z_{r,c'}| \right) \quad (1)$$

Respective operation symbols appearing on the right side of Equation (1) are defined as follows.

[Numeral 2]

$$\operatorname{sgn}(x) \begin{cases} 1 & (x \geq 0) \\ -1 & (x < 0) \end{cases} \quad (2)$$

[Numeral 3]

$$\bigotimes_{i \in I} z_i = z_1 \otimes z_2 \otimes \ldots \otimes z_{|I|} \quad (I = \{1, 2, \ldots, |I|\}) \quad (3)$$

[Numeral 4]

$$x \otimes y = f(f(x) + f(y)) \quad (4)$$

[Numeral 5]

$$f(x) = \ln \frac{\exp(x) + 1}{\exp(x) - 1} \quad (5)$$

Next, the column operation will be described. Here, $M(c)$ is set as a set of rows on which an element on the column c of the parity-check matrix is 1. In the column operation, the column LLR $z_{r,c}$ is calculated in relation to the row LLR $\varepsilon_{r,c'}$ determined in the row operation using Equation (6), shown below.

[Numeral 6]

$$z_{r,c} = \lambda_c + \sum_{r' \in M(c) \setminus \{r\}} \varepsilon_{r',c} \quad (6)$$

Further, a transmission bit $b_c$ is estimated (a decoding result of the LDPC code is calculated) using Equation (7). When, as a result of Equation (7), $z_c$ equals or exceeds 0, a $c^{th}$ bit $b_c$ of the received sequence is set at 1, and when $z_c$ is smaller than 0, $b_c$ is set at 0.

[Numeral 7]

$$z_c = \lambda_c + \sum_{r \in M(c)} \varepsilon_{r,c} \quad (7)$$

After performing the row operation on the column LLR obtained from Equation (6), the operations are repeated, and when either a predetermined upper limit number of iterations is reached or the estimated bit is a codeword (i.e. can be determined by a parity check), an estimated bit sequence $b_c$ is output, whereupon decoding is terminated.

With the sum-product decoding method, indices and logarithms must be calculated during the row operation, as illustrated in Equation (1) and Equations (2) to (5), leading to an increase in the calculation amount.

In PTL 1 and PTL 2 serving as further patent literature, several decoding methods with which the calculation amount is reduced by approximating Equation (1) are described. A min-sum decoding method using Equation (8), shown below, in place of Equation (1) may be cited as a representative approximation method.

[Numeral 8]

$$\varepsilon_{r,c} = \left( \prod_{c' \in N(r) \setminus \{c\}} \operatorname{sgn}(z_{r,c'}) \right) \cdot \min_{c' \in N(r) \setminus \{c\}} \{|z_{r,c'}|\} \quad (8)$$

In the min-sum decoding method, an operation consisting of the indices and logarithms appearing in Equation (1) is approximated by calculating a minimum value of an absolute value of $z_{r,c}$, as illustrated in Equation (8).

However, the approximation precision of the min-sum decoding method is rough, and therefore the decoding performance deteriorates by a large amount in comparison with the sum-product decoding method. Accordingly, decoding methods exhibiting an improved decoding performance, albeit with a slightly larger calculation amount than the min-sum decoding method, have been devised, and one of these methods is an offset BP-based decoding method in which Equation (1) is replaced by Equation (9), shown below.

[Numeral 9]

$$\varepsilon_{r,c} = \left(\prod_{c' \in N(r)\setminus\{c\}} \text{sgn}(z_{r,c'})\right) \cdot \max\left\{\min_{c' \in N(r)\setminus\{c\}} \{|z_{r,c'}|\} - \alpha, 0\right\} \quad (9)$$

In the offset BP-based decoding method, a minimum value is calculated in a similar manner to the min-sum decoding method, whereupon α is subtracted from the minimum value. α is a constant determined in advance using a density evolution method or the like. In comparison with the min-sum decoding method, only the subtraction operation is added, and therefore the increase in the calculation amount is small. The decoding performance, however, is greatly improved.

A normalized min-sum decoding method (Equation (10)) and a δ-min decoding method (see NPL 1, for example) may also be cited as decoding methods exhibiting a higher decoding performance than the min-sum decoding method, similarly to the offset BP-based decoding method, and PTL 2 discloses a decoding method in which α of the offset BP-based decoding method is made variable in accordance with the minimum value.

[Numeral 10]

$$\varepsilon_{r,c} = \left(\prod_{c' \in N(r)\setminus\{c\}} \text{sgn}(z_{r,c'})\right) \cdot \beta \cdot \min_{c' \in N(r)\setminus\{c\}} \{|z_{r,c'}|\} \quad (10)$$

In all of the decoding methods described above, in which an approximation operation is applied to the sum-product decoding method, a type of low calculation amount processing is performed on the minimum value of the absolute value of $z_{r,c}$ or a value derived therefrom (referred to hereafter as a sub-minimum value), and the obtained result is set as the row LLR $\varepsilon_{r,c}$.

When the sum-product decoding method or a decoding method in which an approximation operation is applied to the sum-product method is mounted on a circuit, column operators for performing the column operation and row operators for performing the row operation are mounted in respective numbers corresponding to the numbers of columns and rows on the parity-check matrix. As shown in FIG. 3, the column operators and row operators are mounted in accordance with the respective columns and rows of the parity-check matrix such that for each 1 on the matrix, a wire is laid between the corresponding column and row in order to input and output data. For example, a matrix element on the fourth row and the second column of the parity-check matrix shown in FIG. 3A is 1, and therefore a wire is laid between a row operator #4 and a column operator #2, as shown in FIG. 3B. Wires are laid similarly between the column operators and the row operators of the columns and rows where the matrix elements of the parity-check matrix are 1.

CITATION LIST

Patent Literature

[PTL 1] WO 2006/059688 A1
[PTL 2] JP 2011-4229 A

Non Patent Literature

[NPL 1] Rui SAKAI, Wataru MATSUMOTO, Hideo YOSHIDA, "Reduced Complexity Decoding Based on Approximation of Update Function for Low-Density Parity-Check Codes", Institute of Electronics, Information, and Communication Engineers, February 2007, IEICE Journal A, Vol. J90-A, no. 2, p. 83-91

SUMMARY OF INVENTION

Technical Problem

In a conventional decoding circuit for decoding an LDPC code, the wires between the column operators that perform the column operation and the row operators that perform the row operation are laid in accordance with the positions of the is on the parity-check matrix, and therefore, when the number of is is large, the number of wires increases. Further, the positions of the is on the parity-check matrix are basically irregular, and therefore the wiring becomes complicated.

This invention has been designed to solve the problems described above, and an object thereof is to obtain an error correction decoding apparatus with which the mountability of a decoding circuit for decoding an LDPC code can be improved by reducing the number of wires and the complexity of the wiring.

Solution to Problem

This invention is an error correction decoding apparatus for decoding a received sequence encoded using an LDPC code, including column operators and row operators provided respectively in accordance with columns and rows of a check matrix of the LDPC code, wherein a received LLR (log-likelihood ratio) of the received sequence is input into the column operators together with row LLRs from the row operators, whereupon the column operators calculate a total value of the received LLR of the received sequence and the row LLRs from the row operators, and the row operators hold operation results relating to row LLRs or column LLRs obtained during a previous operation, calculate column LLRs using the total value input from the column operators and the held operation results, calculate row LLRs from the calculated column LLRs, and output the calculated row LLRs to the column operators.

Advantageous Effects of Invention

This invention is an error correction decoding apparatus for decoding a received sequence encoded using an LDPC code, including column operators and row operators provided respectively in accordance with columns and rows of a check matrix of the LDPC code, wherein a received LLR (log-likelihood ratio) of the received sequence is input into the column operators together with row LLRs from the row operators, whereupon the column operators calculate a total value of the received LLR of the received sequence and the row LLRs from the row operators, and the row operators hold operation results relating to row LLRs or column LLRs obtained during a previous operation, calculate column LLRs using the total value input from the column operators and the held operation results, calculate row LLRs from the calculated column LLRs, and output the calculated row LLRs to the column operators. Accordingly, the number of wires can be reduced, enabling a reduction in the complexity of the wiring, and as a result, the mountability of the decoding circuit for decoding the LDPC code can be improved.

BRIEF DESCRIPTION OF DRAWINGS

FIG. 1 is a view showing an example of a low-density parity-check matrix.

FIG. 2 is a view showing an example of a parity-check matrix constituted by an m×n matrix.

FIG. 3A is a view showing an example of conventional column operators, row operators, and wires.

FIG. 3B is a view showing an example of conventional column operators, row operators, and wires.

FIG. 9 is a view showing an example of an operation performed by a row operator in an error correction decoding apparatus according to a second embodiment of this invention.

DESCRIPTION OF EMBODIMENTS

First Embodiment

Figure 4:
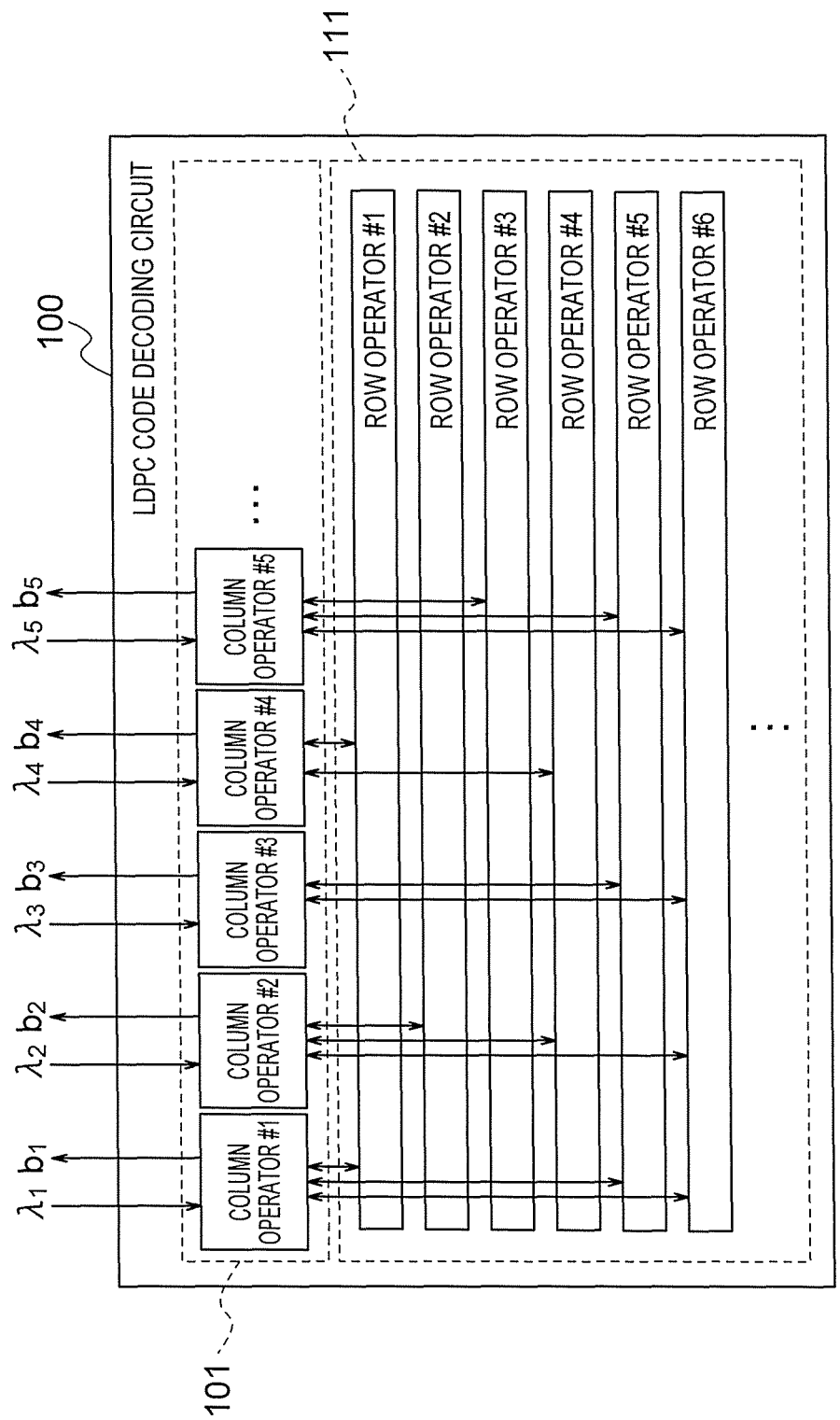
FIG. 4 is a view showing a configuration of an error correction decoding apparatus according to a first embodiment of this invention.

FIG. 4 shows an example configuration of an error correction decoding apparatus according to a first embodiment of this invention. In FIG. 4, an LDPC code decoding apparatus (referred to hereafter as an LDPC decoding circuit 100) for decoding a received sequence encoded using an LDPC code is shown as an example of the error correction decoding apparatus. As shown in FIG. 4, the LDPC decoding circuit 100 is constituted by column operators 101 and row operators 111. The column operators 101 and the row operators 111 are provided respectively in numbers corresponding to the number of columns and the number of rows on a parity-check matrix.

The LDPC decoding circuit 100 uses received LLRs $\lambda_c$ corresponding to respective columns c of the parity-check matrix as input, and outputs estimated bit sequences $b_c$ corresponding to the respective columns c. Here, as described above, the respective columns c refer to columns included in a set N(r) of column numbers at which an element on an $r^{th}$ row of the parity-check matrix is 1. Further, as described above, the received LLRs $\lambda_c$ are received LLRs corresponding to the columns c.

The column operators 101 are constituted by a plurality of column operators #1, #2, . . . , #n corresponding respectively to the columns of the parity-check matrix. Accordingly, n denotes the number of columns on the parity-check matrix.

The row operators 111 are constituted by a plurality of row operators #1, #2, . . . , #m corresponding respectively to the rows of the parity-check matrix. Accordingly, m denotes the number of rows on the parity-check matrix.

The column operators 101 and row operators 111 exchange data repeatedly either a predetermined number of times or a number of times determined midway through an operation. The column operators 101 then calculate the estimated bit sequences $b_c$ on the basis of Equation (7) and output the calculated estimated bit sequences $b_c$.

In this invention, the operations performed by the column operator and the row operator differ from those of a conventional configuration. Therefore, before describing the error correction decoding apparatus according to the first embodiment of this invention, conventional column and row operators will be described.

Figure 5:
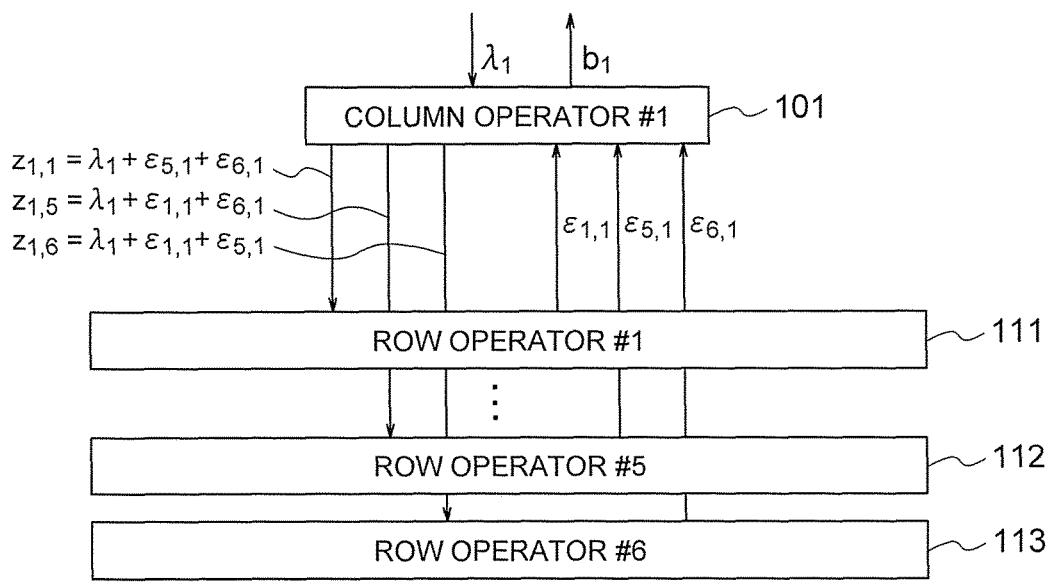
FIG. 5 is a view showing an example of an operation performed by a conventional column operator.
Figure 6:
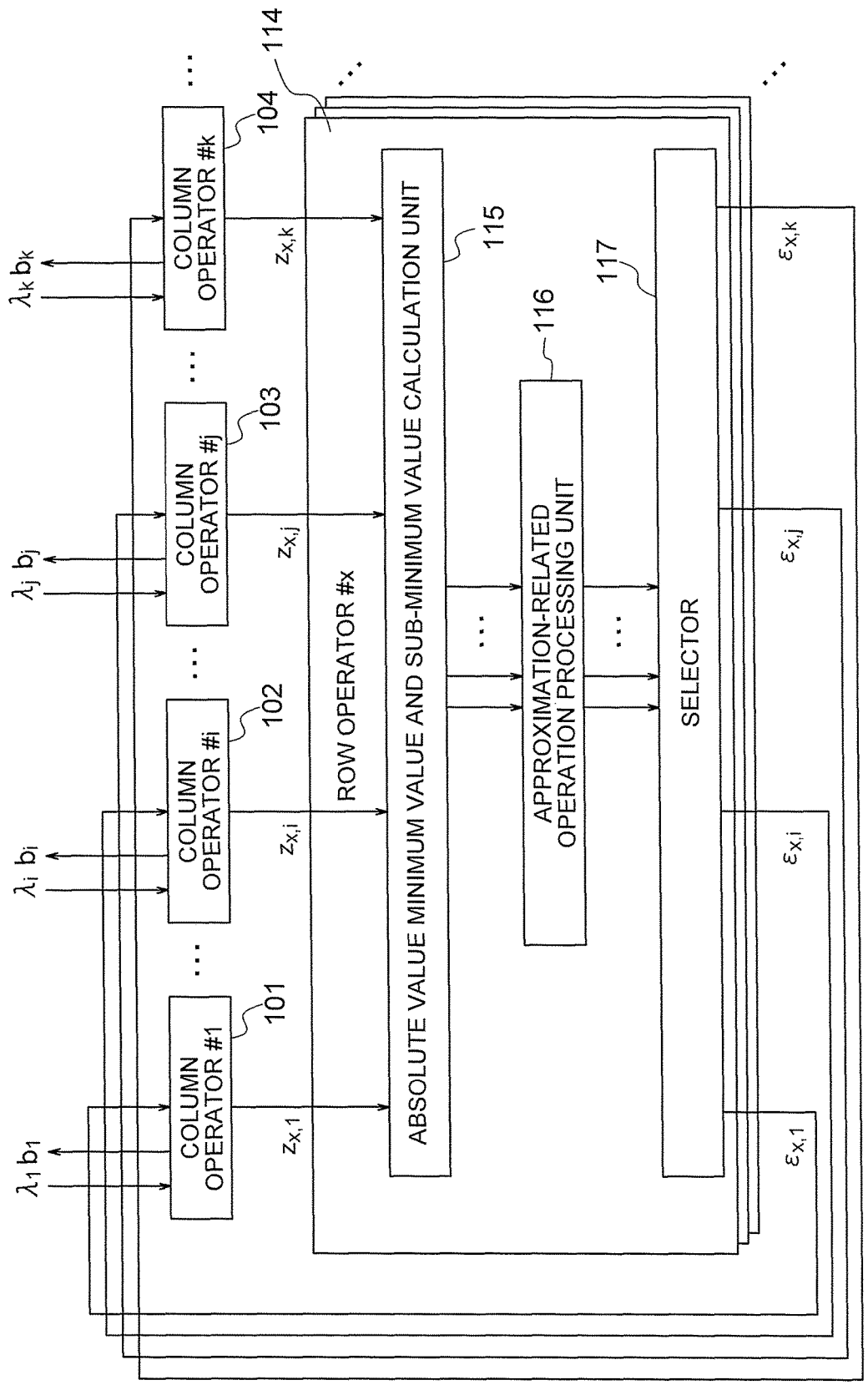
FIG. 6 is a view showing an example of an operation performed by a conventional row operator.

First, FIGS. 5 and 6 respectively show example configurations of conventional column and row operators.

It is assumed, for example, that the column operator 101 shown in FIG. 5 is connected to a row operator #1 111, a row operator #5 112, and a row operator #6 113 in accordance with the positions of the 1 elements on the parity-check matrix. The column operator 101 uses row LLRs $\varepsilon_{1,1}$, $\varepsilon_{5,1}$, $\varepsilon_{6,1}$ output from the respective row operators 111, 112, 113 as input, and outputs $z_{1,1}$, $z_{1,5}$, $z_{1,6}$, calculated on the basis of Equation (6), respectively to the row operator #1 111, the row operator #5 112, and the row operator #6 113. In FIG. 5, $z_{1,1}=\lambda_1+\varepsilon_{5,1}+\varepsilon_{6,1}$, $z_{1,5}=\lambda_1+\varepsilon_{1,1}+\varepsilon_{6,1}$, and $z_{1,6}=\lambda_1+\varepsilon_{1,1}+\varepsilon_{5,1}$ are specific calculation results obtained from Equation (6).

In the row operator 111, the row operator 112, and the row operator 113, the row LLRs $\varepsilon_{1,1}$, $\varepsilon_{5,1}$, $\varepsilon_{6,1}$ are calculated respectively on the basis of Equations (1) to (5) in accordance with the sum-product decoding method, and output to the column operator 101.

FIG. 6 shows an example configuration of the conventional row operators 111, 112, 113 as a row operator #x 114.

In FIG. 6, it is assumed, for example, that the row operator #x 114 is connected to a column operator #1 101, a column operator #i 102, a column operator #j 103, and a column operator #k 104 in accordance with the positions of the 1 elements on the parity-check matrix. The column operators 101 to 104 are configured basically identically to the column operator #1 101 shown in FIG. 5. As shown in FIG. 6, the row operator #x 114 is constituted by an "absolute value minimum value and sub-minimum value calculation unit 115", an "approximation-related operation processing unit 116", and a "selector 117".

The row operator #x 114 shown in FIG. 6 is configured on the basis of a decoding method in which an approximation operation is performed in relation to the sum-product decoding method, such as the min-sum decoding method (Equation (8)), the offset BP-based decoding method (Equation (9)), the normalized min-sum decoding method (Equation (10)), or the δ-min decoding method.

The absolute value minimum value and sub-minimum value calculation unit 115 receives input column LLRs $z_{x,1}$, $z_{x,i}$, $z_{x,j}$, $z_{x,k}$ calculated respectively by the column operator #1 101, the column operator #i 102, the column operator #j 103, and the column operator #k 104, and calculates a minimum value and a value derived from the minimum value from respective absolute values of the column LLRs. More specifically, when the min-sum decoding method (Equation (8)) or an approximation of a decoding method based on the min-sum decoding method, such as the offset BP-based decoding method (Equation (9)) or the normalized min-sum decoding method (Equation (10)), is used by the approximation-related operation processing unit 116 and the selector 117 in a subsequent stage, the absolute value minimum value and sub-minimum value calculation unit 115 calculates the minimum value and the second smallest value among the absolute values of the respective inputs $z_{x,c}$, or in other words the inputs $z_{x,1}$, $z_{x,i}$, $z_{x,j}$, $z_{x,k}$. When, on the other hand, the δ-min decoding method or a similar approximation thereto is used by the approximation-related operation processing unit 116 and the selector 117 in a subsequent stage, the absolute value minimum value and sub-minimum value calculation unit 115 calculates the minimum value, the second smallest value, and the third smallest value among the absolute values of the respective inputs $z_{x,c}$, or in other words the inputs $z_{x,1}$, $z_{x,i}$, $z_{x,j}$, $z_{x,k}$. Note that the number of sub-minimum values determined in relation to the minimum value may be set freely in accordance with a desired approximation precision, and in this invention there are no limitations thereon. In other words, this invention may be applied to any decoding method as long as the minimum value, the second smallest value, the third smallest value, and larger values (referred to hereafter as sub-minimum values) can be calculated by the absolute value minimum value and sub-minimum value calculation unit 115, and row LLRs can be calculated by the approximation-related operation processing unit 116 and the selector 117 in a subsequent stage from these calculated values.

When the offset BP-based decoding method (Equation (9)), the normalized min-sum decoding method (Equation (10)), or the δ-min decoding method is used by the selector 117 in a subsequent stage, the approximation-related operation processing unit 116 performs various operations on the minimum value, the second smallest value, and so on as pre-processing. For example, when the offset BP-based decoding method is used, operations such as subtracting α from a minimum value $|z_{r,c}|$ in Equation (9) are performed. When the approximation-related operation processing unit 116 performs pre-processing in this manner, the operation load of the selector 117 in a subsequent stage decreases, and therefore a circuit configuration of the selector 117 can be simplified. Needless to mention, when similar processing to that of the min-sum decoding method (Equation (8)) is performed, there is no particular need for the approximation-related operation processing unit 116, and therefore the approximation-related operation processing unit 116 may be omitted.

The selector 117 calculates output values (row LLRs $\varepsilon_{x,c}$) to be output to the respective column operators #c, or in other words the column operators #1, #i, #j, #k 101 to 104, by performing operation processing in accordance with one of the offset BP-based decoding method (Equation (9)), the normalized min-sum decoding method (Equation (10)), the δ-min decoding method, the min-sum decoding method (Equation (8)), or the like using the output of the approximation-related operation processing unit 116, and outputs the calculated output values. More specifically, the selector 117 calculates a positive/negative sign $sg_{x,c}$ in relation to the output of the approximation-related operation processing unit 116 using Equation (11), then calculates row LLRs $\varepsilon_{x,1}$, $\varepsilon_{x,i}$, $\varepsilon_{x,j}$, $\varepsilon_{x,k}$ to be output to the respective column operators #1 101, #i, 102, #j 103, #k 104 using one of Equations (8) to (10) or the like, and then selects the appropriate column operators #1 101, #i 102, #j 103, #k 104 and outputs the calculated row LLRs $\varepsilon_{x,1}$, $\varepsilon_{x,i}$, $\varepsilon_{x,j}$, $\varepsilon_{x,k}$ thereto. Note that the positive/negative sign calculation of Equation (11) may be performed in another location.

[Numeral 11]

$$sg_{x,c} = \left( \prod_{c' \in N(x)\setminus\{c\}} \mathrm{sgn}(z_{x,c'}) \right) \quad (11)$$

Note that in the above description, the approximation-related operation processing unit 116 and the selector 117 are provided separately, but the invention is not necessarily limited thereto, and these units may be integrated. The approximation-related operation processing unit 116 and the selector 117 together constitute an operation unit that calculates row LLRs from the minimum value and the sub-minimum value of the absolute values, output from the absolute value minimum value and sub-minimum value calculation unit 115, and will therefore be referred to collectively hereafter simply as an operation unit.

The prior art was described above. Next, the column operator and row operator according to the first embodiment of this invention will be described.

Figure 7:
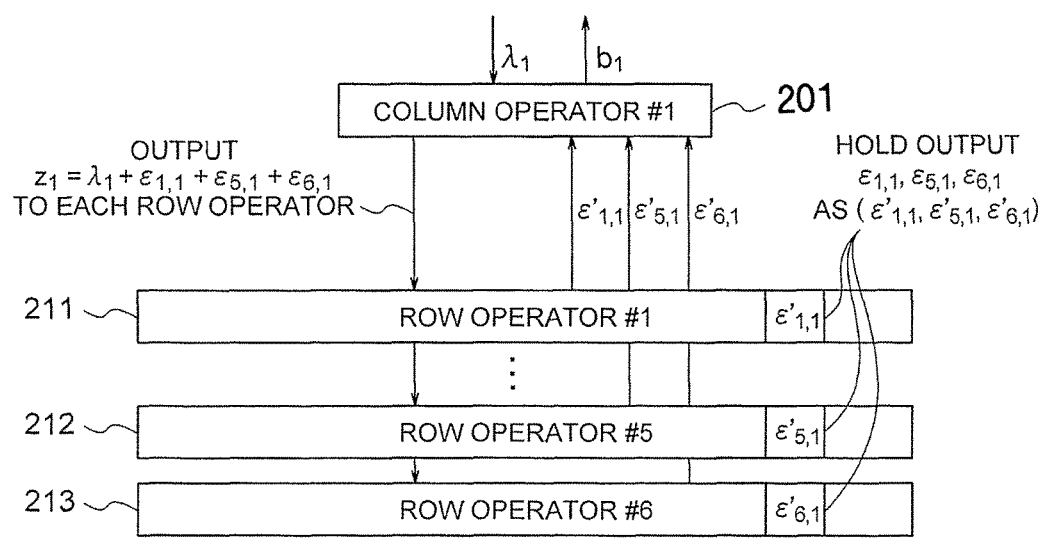
FIG. 7 is a view showing an example of an operation performed by a column operator in the error correction decoding apparatus according to the first embodiment of this invention.

FIG. 7 shows the configuration of the column operator according to the first embodiment of this invention.

In FIG. 7, it is assumed, for example, that a column operator #1 201 is connected to three row operators, namely a row operator #1 211, a row operator #5 212, and a row operator #6 213 in accordance with the positions of the 1 elements on the parity-check matrix. A received LLR $\lambda_1$ of a received sequence to be decoded and row LLRs $\varepsilon_{1,1}$, $\varepsilon_{5,1}$, $\varepsilon_{6,1}$ output from the row operators 211 to 213 are input into the column operator #1 201. The column operator #1 201 determines a total value $z_1$ of the received LLR and the row LLRs by performing a similar operation to that of Equation (7), i.e. $z_1 = \lambda_1 + \varepsilon_{1,1} + \varepsilon_{5,1} + \varepsilon_{6,1}$, using the input values, and outputs the total value $z_1$ to the row operator #1 211, the row operator #5 212, and the row operator #6 213. In this embodiment, in contrast to the prior art, an operation to determine a column LLR using Equation (6) is not performed by the column operator #1 201, and a column LLR is not output. A feature that differs greatly from the conventional configuration shown in FIG. 5 is that in the conventional column operator 101, as shown in FIG. 5, a different value ($z_{1,1}$, $z_{1,5}$, $z_{1,6}$) is output to each connected row operator, whereas in this embodiment, as shown in FIG. 7, the column operator 201 outputs an identical value (the total value $z_1$ alone) to all of the connected row operators 211 to 213. As a result, the complexity of the wiring is greatly reduced, leading to an improvement in mountability.

The row operator #1 211, the row operator #5 212, and the row operator #6 213 each include a storage unit (not shown), and the row LLRs $\varepsilon_{1,1}$, $\varepsilon_{5,1}$, $\varepsilon_{6,1}$ output to the column operator #1 201 are stored in the corresponding storage units. Here, $\varepsilon_{1,1}$, $\varepsilon_{5,1}$, and $\varepsilon_{6,1}$ are expressed respectively as $\varepsilon'_{1,1}$, $\varepsilon'_{5,1}$, and $\varepsilon'_{6,1}$ when stored in the storage units. In the row operator #1 211, the row operator #5 212, and the row operator #6 213 according to this embodiment, column LLRs $z_{1,1}$, $z_{5,1}$, $z_{6,1}$ are obtained by subtracting $\varepsilon'_{1,1}$, $\varepsilon'_{5,1}$, and $\varepsilon'_{6,1}$ stored in the respective storage units from the total value $z_1$ input from the column operator #1 201. This will be described in detail below.

Next, using FIG. 8, the configuration of the row operator according to this embodiment will be described.

Figure 8:
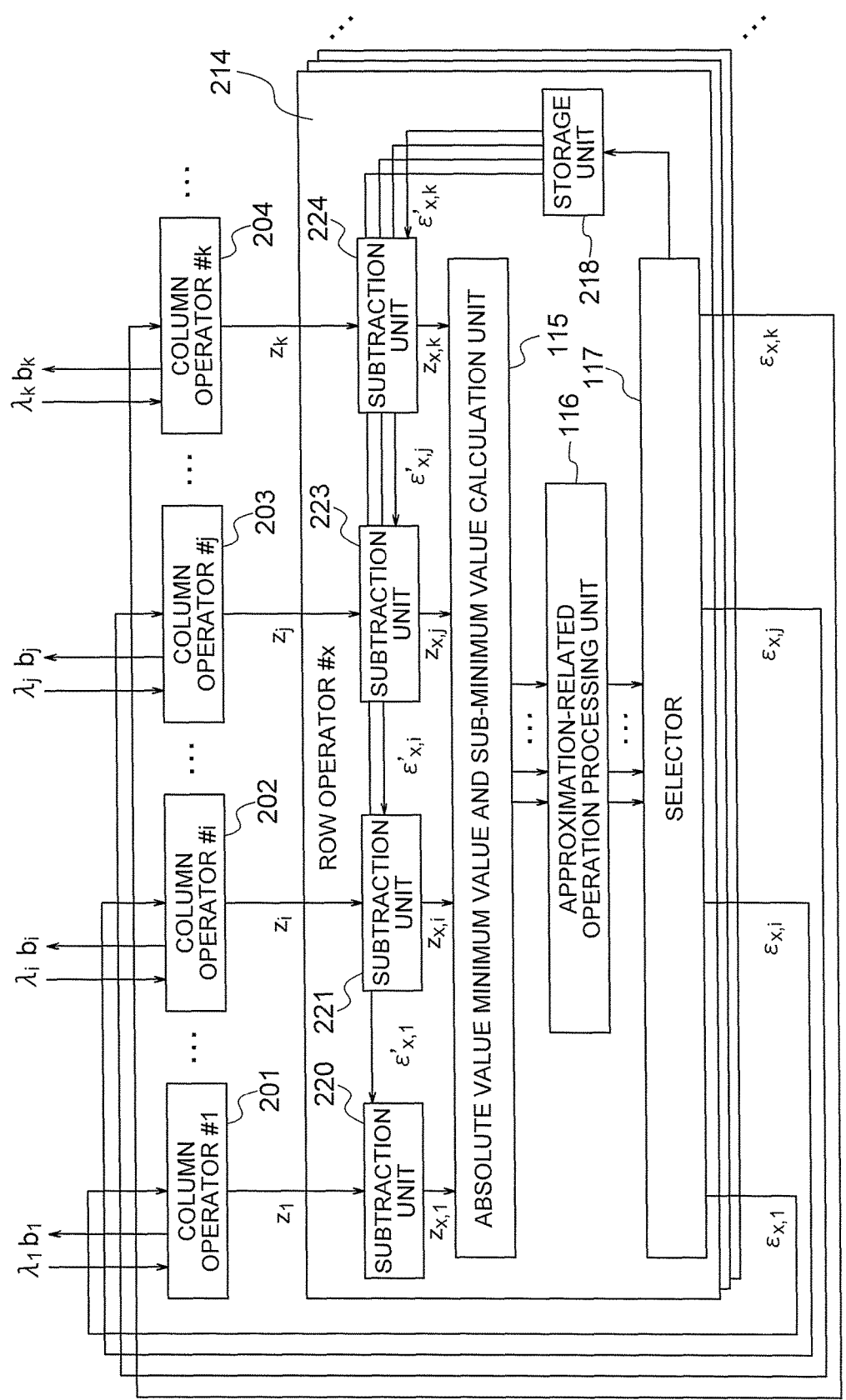
FIG. 8 is a view showing an example of an operation performed by a row operator in the error correction decoding apparatus according to the first embodiment of this invention.

As shown in FIG. 8, it is assumed, for example, that a row operator #x 214 is connected to a column operator #1 201, a column operator #i 202, a column operator #j 203, and a column operator #k 204 in accordance with the positions of the 1 elements on the parity-check matrix. Note that the respective column operators 201 to 204 are connected to row operators other than the row operator #x 214, and as described above, connection relationships are determined in accordance with the parity-check matrix. The row operator #x 214 is constituted by the "absolute value minimum value and sub-minimum value calculation unit 115", the "approximation-related operation processing unit 116", the "selector 117", a "storage unit 218", and "subtraction units 220, 221, 223, 224". The "approximation-related operation processing unit 116" is similar to the conventional unit shown in FIG. 6, and therefore detailed description thereof has been omitted here. A feature that differs greatly from FIG. 6 is that in this embodiment, as shown in FIG. 8, the storage unit 218 and the subtraction units 220, 221, 223, 224 are added.

The absolute value minimum value and sub-minimum value calculation unit 115 receives column LLRs $z_{x,1}$, $z_{x,i}$, $z_{x,j}$, $z_{x,k}$ input from the subtraction units 220, 221, 223, 224, to be described below, and calculates a minimum value and a value derived from the minimum value from the respective absolute values of the column LLRs. The absolute value minimum value and sub-minimum value calculation unit 115 uses an identical calculation method to the conventional absolute value minimum value and sub-minimum value calculation unit 115 shown in FIG. 6, and therefore description thereof has been omitted here.

The content of the operation processing performed by the selector 117 is identical to that of the selector 117 shown in FIG. 6, and therefore description thereof has been omitted here. However, a feature that differs from FIG. 6 is that in FIG. 8, an output line of the selector 117 is connected to the storage unit 218 as well as the respective column operators 201 to 204. Identical values to the values output to the column operators 101 to 104 in the conventional configuration (FIG. 6), or in other words the row LLRs $\varepsilon_{x,c}$, are output to these output lines. More specifically, the row LLR $\varepsilon_{x,1}$ is output to the column operator #1 201, the row LLR is output to the column operator #i 202, the row LLR $\varepsilon_{x,j}$ is output to the column operator #j 203, and the row LLR $\varepsilon_{x,k}$ is output to the column operator #k 204, while the row LLRs $\varepsilon_{x,1}$, $\varepsilon_{x,i}$, $\varepsilon_{x,j}$, $\varepsilon_{x,k}$ (referred to collectively hereafter as the row LLRs $\varepsilon_{x,c}$) are output to the storage unit 218.

The storage unit 218 stores the output from the selector 117, or in other words the row LLRs $\varepsilon_{x,c}$. Here, the respective values of the stored row LLRs $\varepsilon_{x,c}$ are expressed as $\varepsilon'_{x,c}$. The storage unit 218 outputs the stored row LLR $\varepsilon'_{x,1}$ to the subtraction unit 220 as appropriate at a timing when $\varepsilon_{x,1}$ is input into the row operator #x 214 as $z_1$ after having been output to the column operator #1 201 from the selector 117 and processed by the column operator #1 201. Similarly, the storage unit 218 outputs $\varepsilon'_{x,i}$ to the subtraction unit 221 as appropriate at a timing where $\varepsilon_{x,i}$ is input into the row operator #x 214 as $z_1$ after having been output to the column operator #i 202 from the selector 117 and processed by the column operator #i 202. Similar operations are performed with respect to the other subtraction units 223, 224.

In the subtraction unit 220, the column LLR $z_{x,1}$ is calculated by performing subtraction processing $z_{x,1} = z_1 - \varepsilon'_{x,1}$ to subtract $\varepsilon'_{x,1}$ from the total value $z_1$ input from the column operator #1 201. Similar processing to that of the subtraction unit 220 is performed in the subtraction unit 221, the subtraction unit 223, and the subtraction unit 224, whereby a column LLR $z_{x,i}$ ($=z_1-\varepsilon'_{x,i}$), a column LLR $z_{x,j}$ ($=z_1-\varepsilon'_{x,j}$), and a column LLR $z_{x,k}$ ($=z_1-\varepsilon'_{x,k}$) are respectively calculated.

Note that any number of column operators may be connected to the row operator #x 214, and this embodiment may be configured such that the number of connected column operators is different to the four shown in FIG. 8. The number of provided subtraction units and the processing performed by the other units differ according to the number of connected column operators, but a person having technical knowledge in this field could easily conceive of this from the content described heretofore.

With a conventional column operator, output values to be output to the respective row operators are calculated in a number corresponding to the number of connected row operators so that a different value can be output to each connected row operator. In the row operator #x 214 according to this embodiment, however, the row LLR $\varepsilon_{x,c}$ obtained in the previous operation is held as $\varepsilon'_{x,c}$ and subtracted from the total value $z_c$. Therefore, the respective column operators 201 to 204 can output an identical value (the total value $z_c$ alone) to the row operators connected thereto. According to this embodiment, identical values are output to the row operators from the column operators, and therefore the complexity of the wiring can be reduced, leading to an improvement in mountability.

Further, with a conventional column operator, in a case where the output values of the column operators are output after being stored temporarily in a flip-flop, one flip-flop must be provided for each connected row operator so that a different value can be output to each connected row operator. In this embodiment, however, an identical value is output to the connected row operators, and therefore only one type of flip-flop is required. According to this embodiment, the number of flip-flops can be reduced, leading to a reduction in circuit scale.

In this embodiment, as described above, an LDPC code decoding apparatus for decoding a received sequence encoded using an LDPC code includes the plurality of column operators 201 to 204 and the plurality of row operators 214 provided in accordance with the respective columns and rows of the check matrix of the LDPC code. The received LLR of the received sequence is input into the column operators 201 to 204 together with the row LLRs from the row operators 214, whereupon the column operators 201 to 204 calculate the total value $z_c$ of the received LLR of the received sequence and the row LLRs from the row operators 214. Further, the row operators 214 hold calculation results relating to row LLRs or column LLRs obtained during a previous operation, calculate column LLRs using the total value $z_c$ input from the column operators 201 to 204 and the held calculation results, calculate row LLRs from the calculated column LLRs, and output the calculated row LLRs to the column operators. Hence, the column operators 201 to 204 are configured to calculate only the total value $z_c$ of the received LLR and the row LLRs from the row operators 214 without determining column LLRs, and to output an identical value (the total value $z_c$) to all of the row operators. As a result, reductions can be achieved in the number of wires laid between the column operators and the row operators and the complexity of the wiring, leading to an improvement in the mountability of the LDPC code decoding circuit.

Further, in this embodiment, each row operator 214 includes the storage unit 218 for holding, in relation to the respective columns, the row LLRs obtained during the previous operation and output to the column operators 201 to 204 during the previous operation, the subtraction units 220, 221, 223, 224 for calculating the column LLR of each column by subtracting the row LLR obtained in the previous operation and held in the storage unit for each column from the total value $z_c$ input from the column operators 201 to 204, the absolute value minimum value and sub-minimum value calculation unit 115 for calculating the minimum value and the sub-minimum value from the absolute values of the column LLRs of the respective columns, output from the subtraction units 220, 221, 223, 224, and the operation unit 116, 117 for calculating the row LLRs from the minimum value and sub-minimum value of the absolute values, output from the absolute value minimum value and sub-minimum value calculation unit 115, and outputting the calculated row LLRs. With a conventional column operator, output values to be output to the respective row operators are calculated in a number corresponding to the number of connected row operators so that a different value can be output to each connected row operator. With the row operators 214 according to this embodiment, configured as described above, however, the row LLRs $\varepsilon_{x,c}$ are held and subtracted from the total value $z_c$, and therefore the respective column operators 201 to 204 can output an identical value to the row operators 214 connected thereto. Hence, according to this embodiment, identical values are output to the row operators from the column operators, and therefore the complexity of the wiring can be reduced, leading to an improvement in mountability.

Furthermore, in this embodiment, the decoding processing of the selector 117 is performed using a decoding method in which an approximation operation is applied to the sum-product decoding method, such as the min-sum decoding method (Equation (8)), the offset BP-based decoding method (Equation (9)), the normalized min-sum decoding method (Equation (10)), or the δ-min decoding method, instead of the sum-product decoding method, and therefore an effect of reducing the calculation amount is obtained.

Second Embodiment

In the first embodiment described above, the row operators 214 hold the row LLRs $\varepsilon_{x,c}$ obtained during the previous operation in the storage unit and subtract the held row LLRs $\varepsilon_{x,c}$ from the inputs obtained from the respective column operators 201 to 204, and as a result, the column operators 201 to 204 can output identical values to the row operators connected thereto. However, the storage unit 218 must be disposed in the row operator. In this embodiment, a method of disposing the storage unit is modified.

FIG. 9 shows a configuration of a row operator #x 314 of an error correction decoding apparatus according to this embodiment.

On the basis of the parity-check matrix, it is assumed, for example, that the row operator #x 314 is connected to the column operator #1 201, the column operator #i 202, the column operator #j 203, and the column operator #k 204. Note that the respective column operators are connected to row operators other than the row operator #x 314, and as described above, the connection relationships are determined in accordance with the parity-check matrix. The row operator #x 314 is constituted by the "absolute value minimum value and sub-minimum value calculation unit 115", the "approximation-related operation processing unit 116", the "selector 117", a "storage unit 318", an "approximation-related operation processing unit 2 319", and the "subtraction units 220, 221, 223, 224".

The column operator #1 201, the column operator #i 202, the column operator #j 203, the column operator #k 204, the absolute value minimum value and sub-minimum value calculation unit 115, the approximation-related operation processing unit 116, the selector 117, and the subtraction units 220 to 224 are similar to the first embodiment. This embodiment differs from the first embodiment in that the storage unit 318 is provided in place of the storage unit 218, and that the approximation-related operation processing unit 2 319 is added. Hence, the storage unit 318 and the approximation-related operation processing unit 2 319, which differ from the first embodiment, will be described here.

The storage unit 318 holds the output from the absolute value minimum value and sub-minimum value calculation unit 115. More specifically, the storage unit 318 stores the minimum value and sub-minimum value of the absolute values of the column LLRs $z_{x,1}$, $z_{x,i}$, $z_{x,j}$, $z_{x,k}$, which are output from the subtraction units 220, 221, 223, 224, calculated by the absolute value minimum value and sub-minimum value calculation unit 115. The stored minimum value and sub-minimum value are input into the operation processing unit 2 319 and used therein to calculate the row LLRs $\varepsilon'_{x,1}$, $\varepsilon'_{x,i}$, etc.

The approximation-related operation processing unit 2 319 calculates the row LLRs $\varepsilon'_{x,1}$, $\varepsilon'_{x,i}$, etc. on the basis of the minimum value and sub-minimum value output from the storage unit 318. As a calculation method, identical processing to that of the approximation-related operation processing unit 116 is performed. Note, however, that the approximation-related operation processing unit 2 319 also includes a part of the functions of the selector 117, namely a function for selecting the appropriate subtraction unit 220 and outputting the calculated values $\varepsilon'_{x,1}$, $\varepsilon'_{x,i}$, etc. thereto, and a function for calculating the positive/negative sign on the basis of Equation (11).

Note that any number of column operators may be connected to the row operator #x 314, and this embodiment may be configured such that the number of connected column operators is different to the four shown in the drawing. The number of provided subtraction units and the processing performed by the other units differ according to the number of connected column operators, but a person having technical knowledge in this field could easily conceive of this from the content described heretofore.

According to this embodiment, the storage unit can be reduced in size in comparison with the first embodiment, even in a row operator having a large number of connections to column operators, and as a result, the circuit scale can be reduced.

Although the approximation-related operation processing unit 2 319 is required, the processing unit 319 is a merely a circuit that performs a subtraction operation or the like on several values including the minimum value and the second smallest value, as described above, and therefore the processing unit 2 319 has a smaller circuit scale than the other operation units.

Furthermore, likewise in this embodiment, the storage unit not provided in the conventional configuration (FIG. 6) is required, but even in the conventional configuration, a storage unit must be provided somewhere in order to realize a circuit. In the conventional configuration, the storage unit is located in the column operator, the row operator, or on the exterior thereof, and can be configured with a high degree of freedom. Therefore, the storage unit is not shown in FIG. 6. The storage unit provided in this embodiment and the other embodiments includes a part or all of the functions of the storage unit provided in the conventional configuration, and does not therefore contribute greatly to an increase in circuit scale.

According to this embodiment, as described above, similar effects to the first embodiment are obtained. Additionally, in this embodiment, only the minimum value and sub-minimum value calculated by the absolute value minimum value and sub-minimum value calculation unit 115 are stored in the storage unit 318, and therefore, in comparison with the first embodiment, a storage capacity of the storage unit 318 can be reduced, enabling a reduction in circuit scale.

Third Embodiment

In the first and second embodiments described above, configurations in which the column operators are disposed in a number corresponding to the number of columns on the parity-check matrix were described. In this embodiment, the column operators are disposed in a smaller number than the number of columns on the parity-check matrix, and processing is performed on all of the columns by having the column operators implement time-division processing.

Figure 10A:
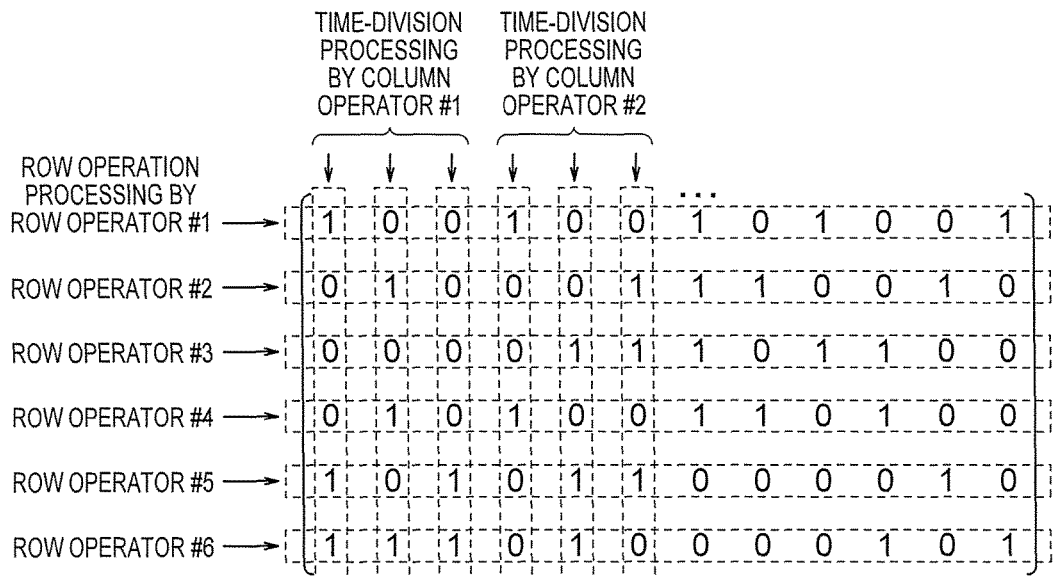
FIG. 10A is a view showing an example of an operation performed by a row operator in an error correction decoding apparatus according to a third embodiment of this invention.
Figure 10B:
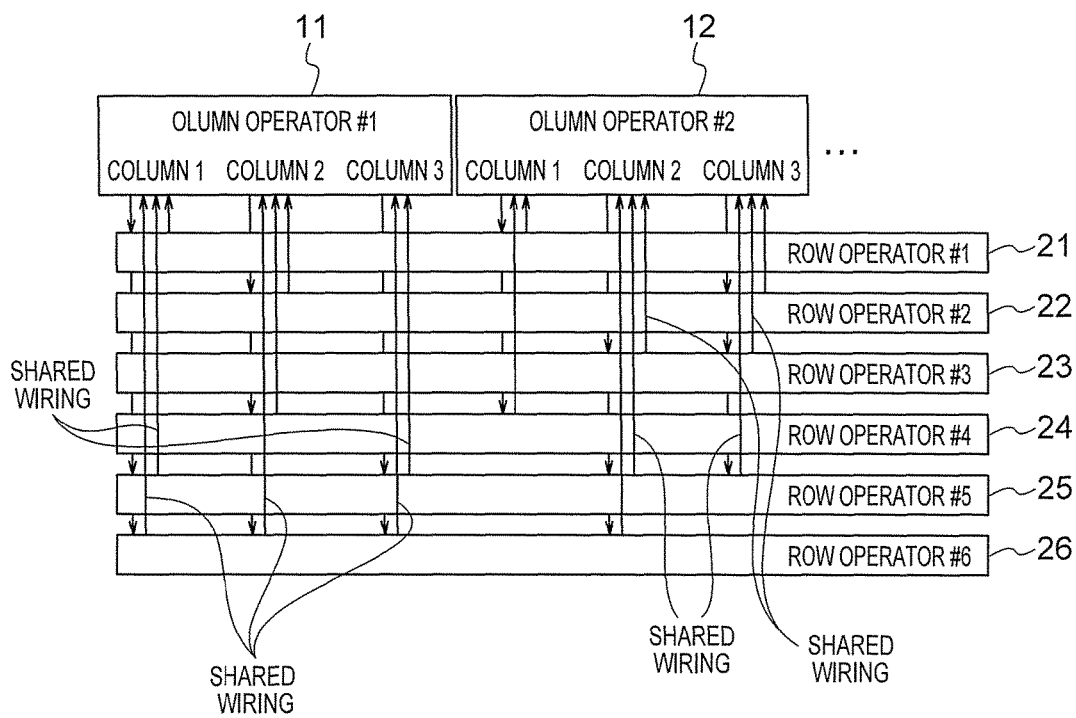
FIG. 10B is a view showing an example of an operation performed by a row operator in an error correction decoding apparatus according to a third embodiment of this invention.

FIG. 10 shows a configuration of an error correction decoding apparatus according to this embodiment. FIG. 10A illustrates an example of a parity-check matrix and the column operators and row operators used to process the columns and rows of the parity-check matrix. In FIG. 10B, a column operator #1 11, a column operator #2 12, a row operator #1 21, a row operator #2 22, a row operator #3 23, a row operator #4 24, a row operator #5 25, and a row operator #6 26 are shown as examples. FIG. 10B shows wiring laid between the respective column operators and row operators, and data input/output relationships are indicated by arrows.

In the example of FIG. 10A, the column operation on the first to third columns and the column operation on the fourth to sixth columns from the left are performed by the column operator #1 11 and the column operator #2 12 which are shown in FIG. 10B, respectively, one column at a time by means of time-division processing. In this case, as shown in FIG. 10B, the column operator #1 11 is connected to the row operator #1 21, the row operator #2 22, the row operator #4 24, the row operator #5 25, and the row operator #6 26 in accordance with the elements of the parity-check matrix. In other words, the column operator #1 in FIG. 10 is wired to all of the row operators to which the column operators #1 to #3 are connected in FIG. 3. As shown in the drawing, however, the column operation is performed by time-division processing, and therefore a wire extending from a row operator to a column operator can be shared by columns having different column numbers. The reason for this is that the column operator #1 performs column processing relating to one column at a certain unit time, and therefore an input signal from the row operator need only relate to one column. For example, the column operator #1 11 and the row operator #6 26 exchange data on all of columns 1, 2, and 3, but the data processed simultaneously by the column operator #1 11 relate to one column, and therefore the wire can be shared. As a result, three wires shown in FIG. 10 can be reduced to a single wire.

To perform the column operation by time-division processing, the input data of the column operator are controlled such that the row LLRs corresponding to the column to be processed at that time are output from the respective row operators. In other words, a column operator #1 402 performs column processing on a set column at a predetermined time. The configuration of the row operator will be described below.

Figure 11:
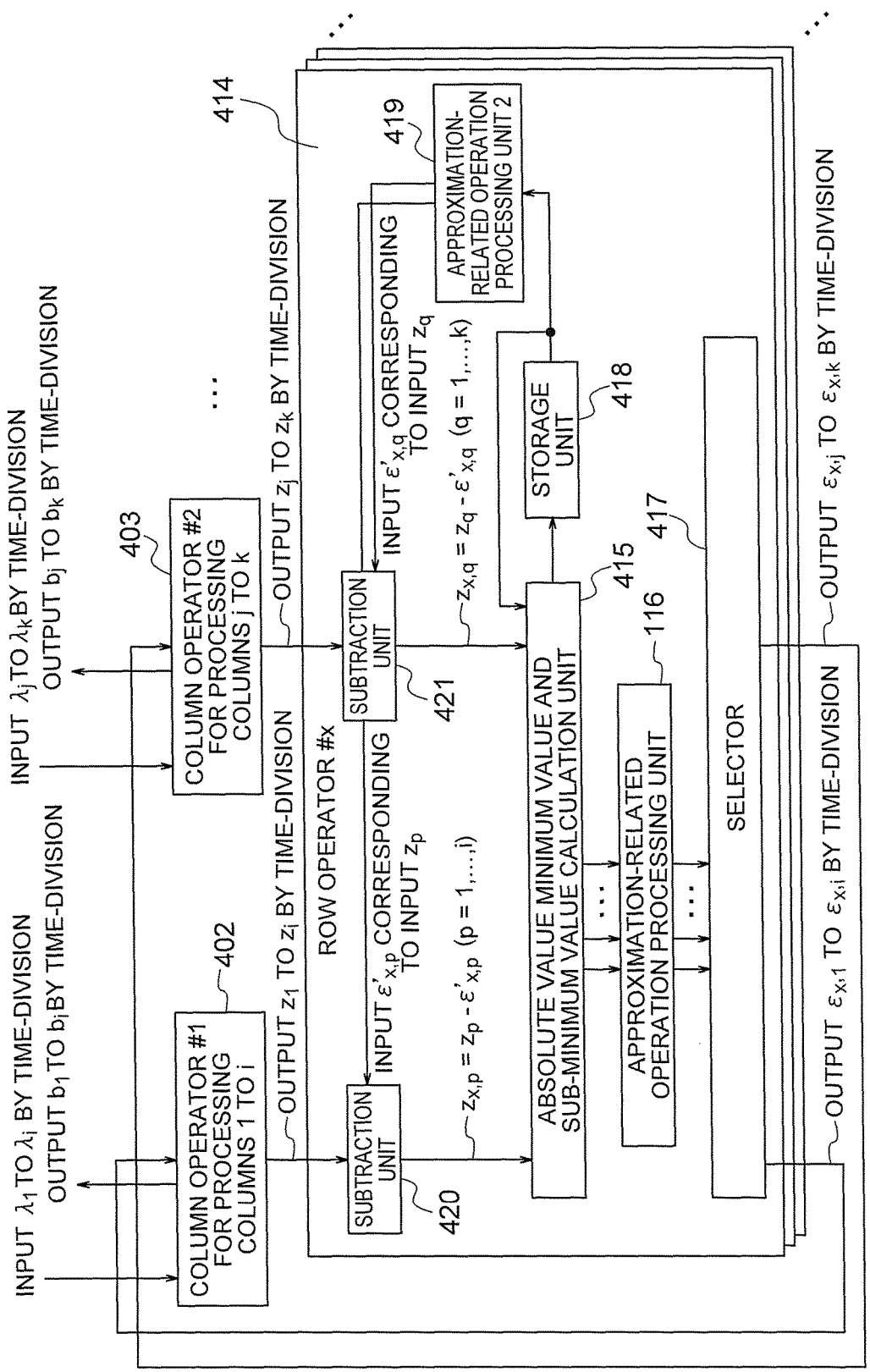
FIG. 11 is a view showing an example of an operation performed by the row operator in the error correction decoding apparatus according to the third embodiment of this invention.

FIG. 11 shows a configuration of an error correction decoding apparatus according to this embodiment.

In this embodiment, as shown in FIG. 11, it is assumed that a row operator #x 414 is connected to a column operator #1 402, a column operator #2 403, and other column operators. Note that the respective column operators are connected to row operators other than the row operator #x 414, and as described above, the connection relationships are determined in accordance with the parity-check matrix. Further, as shown in FIG. 11, the row operator #x 414 is constituted by an "absolute value minimum value and sub-minimum value calculation unit 415", the "approximation-related operation processing unit 116", a "selector 417", a "storage unit 418", an "approximation-related operation processing unit 2 419", and "subtraction units 420, 421".

As described above, the column operator #1 402 performs column processing on a set column at a predetermined time. It is assumed here, for example, that the column processing is performed from column 1 to column i. Control for determining the column to be subjected to the column operation is performed externally so that the row LLRs $\varepsilon_{r,c}$ and the received LLR $\lambda_c$ are selected appropriately and input into the column operator 402 at an appropriate timing. Further, the output estimated bits $b_c$ are stored in an appropriate sequence in an externally disposed storage apparatus such as a buffer memory.

The column operator #2 403 performs similar processing to the column operator #1 402.

The absolute value minimum value and sub-minimum value calculation unit 415 calculates new minimum and sub-minimum values using column LLRs $z_{x,p}$, $z_{x,q}$ input from the subtraction units 420, 421 and minimum and sub-minimum values stored in the storage unit 418 as input, and outputs the calculated minimum and sub-minimum values to the approximation-related operation processing unit 116 and the storage unit 418. Since the column operation processing is performed by time-division processing, this measure is taken so that the minimum value and sub-minimum value of the absolute values can be processed sequentially. Note that here, p and q denote column numbers of the column processing performed by the column operator #1 402 and the column operator #2 403. In other words, p denotes any column number from 1 to i and q denotes any column number from j to k.

The calculation processing performed by the approximation-related operation processing unit 116 is identical to that of the first and second embodiments, and therefore description thereof has been omitted.

The selector 417 calculates output values (the row LLRs $\varepsilon_{x,c}$) to be output to respective column operators #c 402, 403 in accordance with the output of the approximation-related operation processing unit 116, and outputs the calculated output values. Since the column operation is performed by time-division processing, data are not necessarily output to all of the column operators #c 402, 403 connected to the selector 417 at each time. The selector 417 performs a selection such that 0 is output to a connection line connected to a column operator that does not require output. Note that similarly to the selector 117 according to the first and second embodiments, the selector 417 calculates a positive/negative sign in accordance with the output of the approximation-related operation processing unit 116 using Equation (11), calculates the row LLRs to be output to the column operators using one of Equations (8) to (10) or the like, selects the appropriate column operators, and outputs the calculated row LLRs thereto. The positive/negative sign calculation of Equation (11) may be performed in another location.

Similarly to the second embodiment, the storage unit 418 stores the minimum value and sub-minimum value calculated by the absolute value minimum value and sub-minimum value calculation unit 415 during the previous operation, and outputs the stored minimum value and sub-minimum value to the absolute value minimum value and sub-minimum value calculation unit 415 and the approximation-related operation processing unit 2 419. At this time, the absolute value minimum value and sub-minimum value calculation unit 415 updates the minimum value and sub-minimum value stored in the storage unit 418 within a range enabling calculation of $\varepsilon'_{x,p}$, $\varepsilon'_{x,q}$, which are used by the subtraction units 420, 421. The reason for this is that $\varepsilon'_{x,p}$, $\varepsilon'_{x,q}$ used by the subtraction units 420, 421 must be identical to values $\varepsilon'_{x,p}$, $\varepsilon'_{x,q}$ output previously by the row operator #x 414, and therefore, when the minimum value and sub-minimum value stored in the storage unit 418 are updated constantly, it may become impossible to calculate $\varepsilon'_{x,p}$, and $\varepsilon'_{x,q}$ appropriately due to a time difference.

The approximation-related operation processing unit 2 419 calculates the row LLRs $\varepsilon'_{x,p}$, $\varepsilon'_{x,q}$, etc. on the basis of the minimum value and sub-minimum value output from the storage unit 418. Here, p and q indicate the column numbers of the column processing performed by the column operator #1 402 and the column operator #2 403. Accordingly, the values $\varepsilon'_{x,p}$, $\varepsilon'_{x,q}$, etc. corresponding to the column processing performed at that time are calculated and output to the subtraction units 420 and 421. $\varepsilon'_{x,p}$, $\varepsilon'_{x,q}$, etc. are calculated by identical processing to that of the approximation-related operation processing unit 1 116. Note, however, that the approximation-related operation processing unit 2 419 also includes a part of the functions of the selector 417, namely a function for selecting the appropriate subtraction unit 220 and outputting the calculated values $\varepsilon'_{x,1}$, $\varepsilon'_{x,i}$, etc. thereto, and a function for calculating the positive/negative sign on the basis of Equation (11).

The subtraction unit 420 calculates $z_{x,p} = z_p - \varepsilon'_{x,p}$ by performing processing to subtract the row LLR $\varepsilon'_{x,p}$ input from the approximation-related calculation processing unit 2 419 from $z_p$ ($=z_1$ to $z_i$) input from the column operator #1 402, and outputs the calculated value. Note that since the column operation is performed by time-division processing, meaningful data are not always output to the row operator #x 414 from the column operator #1 402. More specifically, on the row of the parity-check matrix to which the row operator #x 414 corresponds and the column in which the column operator #1 402 performs the column operation at a certain time, the matrix element of the parity-check matrix may be 0. In this case, the output value of the subtraction unit 420 is fixed at a predetermined large value regardless of the input value. On a circuit, a bit width of each piece of data is fixed, and therefore a maximum value (a positive value) corresponding to the bit width may be output. When the maximum value is output, the maximum value is automatically ignored by the absolute value minimum value and sub-minimum value calculation unit 415 in the subsequent stage.

The subtraction unit 421 is configured similarly.

Note that any number of column operators may be connected to the row operator #x 414, and this embodiment may be configured such that the number of connected column operators is different to the two shown in FIG. 11. The number of provided subtraction units and the processing performed by the other units differ according to the number of connected column operators, but a person having technical knowledge in this field could easily conceive of this from the content described heretofore.

With the configuration described above, the column operation processing is performed by time-division, and therefore the wiring extending from the row operators to the column operators can be shared. As a result, the complexity of the wiring can be reduced.

Further, by performing the column operation processing by time-division, the number of column operators can be reduced, enabling a reduction in the circuit scale.

The internal configuration of the row operator #x 414 was described above using FIG. 11, but the scope of this invention is not limited to this configuration. For example, in the above description, the subtraction unit 420 performs processing to subtract the row LLR $\varepsilon'_{x,p}$ input from the approximation-related calculation processing unit 2 419 from $z_p$ ($=z_1$ to $z_i$) input from the column operator #1 402, but the following configuration may be employed instead. By having the approximation-related calculation processing unit 2 419 invert the sign of the row LLR $\varepsilon'_{x,p}$ so as to output $-\varepsilon'_{x,p}$ to the subtraction unit 420, the subtraction unit 420 can perform an equivalent operation by adding together $z_p$ and $-\varepsilon'_{x,p}$. This applies likewise to the first and second embodiments.

Further, as regards calculation of the positive/negative sign $sg_{x,c}$ based on Equation (11), Equation (11) does not have to be calculated every time, and instead, a calculation result sync of Equation (12) may be held, and the positive/negative sign $sg_{x,c}$ may be calculated by multiplying $sgn(z_{x,c})$ by sync. Furthermore, by setting $sgn(z_{x,c'})=+1$ at 0, setting $sgn(z_{x,c'})=-1$ at 1, and expressing these respective values as single bits, multiplication of $sgn(z_{x,c'})$ becomes equivalent to an exclusive OR operation. This applies likewise to the first and second embodiments.

[Numeral 12]

$$sync_c = \left( \prod_{c' \in N(x)} sgn(z_{x,c'}) \right) \quad (12)$$

As indicated by these examples, the configurations set forth in the embodiments are merely examples, and this invention may be configured by performing equivalent operations. Likewise in these cases, the effects of reducing the complexity of the wiring and reducing the circuit scale can be obtained.

Moreover, in a similar configuration to the configuration of this embodiment, the row operation processing may be performed by time-division processing. A row operator #x that performs the row operation processing by time-division processing is configured identically to that of FIG. 9 (a case where the column operation is not performed by time-division) or FIG. 11 (a case where both the column operation processing and the row operation processing are performed by time-division processing) apart from slight differences, but the connection relationships between the row operator #x and the column operators differ in accordance with the correspondence between the plurality of rows on which the row operator #x performs time-division processing and the positions of the 1s on the parity-check matrix. Further, the storage capacity of the storage portion must be increased in comparison with the configurations shown in FIGS. 9 and 11 by an amount corresponding to the number of rows processed by the row operator #x. Note, however, that the increase in storage capacity is an increase per row operator, and the total storage capacity, taking into account all of the row operators, is equivalent to that of the configurations shown in FIGS. 9 and 11.

Likewise in this case, similarly to a case where the column operation processing is performed by time-division processing, the wiring can be shared, enabling a reduction in the complexity of the wiring. Furthermore, the number of row operators can be reduced, enabling a reduction in the circuit scale.

In the time-division processing performed during the column operation according to this embodiment, the number of wires that can be shared increases steadily as the number of matrix elements exhibiting 1 on the same row in the plurality of columns subjected to time-division processing by the respective column operators increases, and as a result, the complexity of the wiring can be reduced even further. In one type of LDPC code, known as a spatially-coupled LDPC code, in particular, the parity-check matrix is regular, making it easy to locate a set of columns in which a large number of matrix elements exhibiting 1 are included on the same row in a plurality of columns. In other words, the columns to be subjected to time-division processing by the respective column operators can be allocated efficiently so that a large number of wires can be shared, and as a result, the complexity of the wiring can be reduced. Moreover, likewise in a case where the row operation processing is performed by time-division processing, the rows to be subjected to time-division processing by the respective row operators can be allocated efficiently using the regularity of the parity-check matrix of a spatially-coupled LDPC code, and therefore a large number of wires can be shared, with the result that the complexity of the wiring can be reduced.

According to this embodiment, as described above, similar effects to the first and second embodiments are obtained. Furthermore, in this embodiment, the column operators are disposed in a smaller number than the number of columns on the parity-check matrix, and the columns are processed entirely by time-division processing. Therefore, the wiring extending from the row operators to the column operators can be shared, enabling a reduction in the complexity of the wiring, and the number of column operators can be reduced, enabling a reduction in the circuit scale.

The invention claimed is:

1. The error correction decoding apparatus for decoding a received sequence encoded using an LDPC (low-density parity check) code, comprising:
   column operators and row operators provided respectively in accordance with columns and rows of a check matrix of the LDPC code,
   an input introducing the LLR (log-likelihood ratio) of the received sequence into the column operators together with row LLRs from the row operators, wherein the column operators calculate a total value of the received LLR of the received sequence and the row LLRs from the row operators, and
   the row operators hold operation results relating to row LLRs or column LLRs obtained during a previous operation, calculate column LLRs using the total value input from the column operators and the held operation results, calculate row LLRs from the calculated column LLRs, and output the calculated row LLRs to the column operators, wherein each of the row operators include,
   storage units that hold, for the respective columns, row LLRs obtained in a previous operation and output to the column operators during the previous operation;
   subtraction units that calculate column LLRs for the respective columns by subtracting the row LLRs obtained during the previous operation and held in the storage units for the respective columns from the total value input from the column operators;
   calculation units that calculate a minimum value and a sub-minimum value among absolute values of the column LLRs of the respective columns output from the subtraction units; and
   operation units that calculate the row LLRs from the minimum value and the sub-minimum value of the absolute values, output from the calculation units, and output the calculated row LLRs to the column operators.

2. The error correction decoding apparatus according to claim 1, characterized in that the operation units calculate the row LLRs from the minimum value and the sub-minimum value of the absolute values by performing operation processing in accordance with a min-sum decoding method.

3. The error correction decoding apparatus according to claim 1, characterized in that the operation units calculate the row LLRs from the minimum value and the sub-minimum value of the absolute values by performing operation processing in accordance with an offset BP-based decoding method.

4. The error correction decoding apparatus according to claim 1, characterized in that the operation units calculate the row LLRs from the minimum value and the sub-minimum value of the absolute values by performing operation processing in accordance with a normalized min-sum decoding method.

5. The error correction decoding apparatus according to claim 1, characterized in that the operation units calculate the row LLRs from the minimum value and the sub-minimum value of the absolute values by performing operation processing in accordance with a δ-min decoding method.

6. The error correction decoding apparatus for decoding a received sequence encoded using an LDPC (low-density parity check) code, comprising:
   column operators and row operators provided respectively in accordance with columns and rows of a check matrix of the LDPC code,
   an input introducing the LLR (log-likelihood ratio) of the received sequence into the column operators together with row LLRs from the row operators, wherein the column operators calculate a total value of the received LLR of the received sequence and the row LLRs from the row operators, and the row operators hold operation results relating to row LLRs or column LLRs obtained during a previous operation, calculate column LLRs using the total value input from the column operators and the held operation results, calculate row LLRs from the calculated column LLRs, and output the calculated row LLRs to the column operators, wherein each of the row operators include, storage units that hold, for the respective columns, a minimum value and a sub-minimum value of absolute values of column LLRs calculated during a previous operation;

subtraction units that calculate column LLRs by subtracting row LLRs calculated from the minimum value and the sub-minimum value of the absolute values of the column LLRs, calculated during the previous operation and held in the storage units, from the total value input from the column operators;

calculation units that calculate a minimum value and a sub-minimum value among absolute values of the column LLRs output from the subtraction units, and store the calculated minimum and sub-minimum values of the absolute values in the storage units; and operation units that calculate the row LLRs from the minimum value and the sub-minimum value of the absolute values, output from the calculation units, and output the calculated row LLRs to the column operators.

7. The error correction decoding apparatus according to claim 6, characterized in that the operation units calculate the row LLRs from the minimum value and the sub-minimum value of the absolute values by performing operation processing in accordance with a min-sum decoding method.

8. The error correction decoding apparatus according to claim 6, characterized in that the operation units calculate the row LLRs from the minimum value and the sub-minimum value of the absolute values by performing operation processing in accordance with an offset BP-based decoding method.

9. The error correction decoding apparatus according to claim 6, characterized in that the operation units calculate the row LLRs from the minimum value and the sub-minimum value of the absolute values by performing operation processing in accordance with a normalized min-sum decoding method.

10. The error correction decoding apparatus according to claim 6, characterized in that the operation units calculate the row LLRs from the minimum value and the sub-minimum value of the absolute values by performing operation processing in accordance with a $\delta$-min decoding method.

11. The error correction decoding apparatus for decoding a received sequence encoded using an LDPC (low-density parity check) code, comprising:

column operators and row operators provided respectively in accordance with columns and rows of a check matrix of the LDPC code, an input introducing the LLR (log-likelihood ratio) of the received sequence into the column operators together with row LLRs from the row operators, wherein the column operators calculate a total value of the received LLR of the received sequence and the row LLRs from the row operators, and the row operators hold operation results relating to row LLRs or column LLRs obtained during a previous operation, calculate column LLRs using the total value input from the column operators and the held operation results, calculate row LLRs from the calculated column LLRs, and output the calculated row LLRs to the column operators;

wherein each of the column operators are provided respectively for pluralities of columns of the check matrix of the LDPC code, and perform processing on the pluralities of columns one column at a time by means of time-division, and the row operators respectively comprise:

storage units that hold, for the respective columns, a minimum value and a sub-minimum value of absolute values of column LLRs calculated during a previous operation;

subtraction units that calculate column LLRs by subtracting row LLRs calculated from the minimum value and the sub-minimum value of the absolute values of the column LLRs, calculated during the previous operation and held in the storage units, from the total value input from the column operators;

calculation units that calculate new minimum and sub-minimum values from absolute values of the column LLRs output from the subtraction units and the minimum value and the sub-minimum value of absolute values of the column LLRs stored in the storage units, and update the minimum and sub-minimum values of the absolute values held in the storage units using the new minimum and sub-minimum values; and operation units that calculate the row LLRs from the minimum value and the sub-minimum value of the absolute values, output from the calculation units, and output the calculated row LLRs to the column operators.

12. The error correction decoding apparatus according to claim 11, characterized in that the operation units calculate the row LLRs from the minimum value and the sub-minimum value of the absolute values by performing operation processing in accordance with a min-sum decoding method.

13. The error correction decoding apparatus according to claim 11, characterized in that the operation units calculate the row LLRs from the minimum value and the sub-minimum value of the absolute values by performing operation processing in accordance with an offset BP-based decoding method.

14. The error correction decoding apparatus according to claim 11, characterized in that the operation units calculate the row LLRs from the minimum value and the sub-minimum value of the absolute values by performing operation processing in accordance with a normalized min-sum decoding method.

15. The error correction decoding apparatus according to claim 11, characterized in that the operation units calculate the row LLRs from the minimum value and the sub-minimum value of the absolute values by performing operation processing in accordance with a $\delta$-min decoding method.

* * * * *